(12) United States Patent
Yuan et al.

(10) Patent No.: US 12,324,330 B2
(45) Date of Patent: Jun. 3, 2025

(54) DISPLAY SUBSTRATE AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Dacheng Zhang, Beijing (CN); Can Yuan, Beijing (CN); Yongqian Li, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 556 days.

(21) Appl. No.: 17/789,409

(22) PCT Filed: Sep. 15, 2021

(86) PCT No.: PCT/CN2021/118413
§ 371 (c)(1),
(2) Date: Jun. 27, 2022

(87) PCT Pub. No.: WO2022/089071
PCT Pub. Date: May 5, 2022

(65) Prior Publication Data
US 2023/0043145 A1 Feb. 9, 2023

(30) Foreign Application Priority Data
Oct. 30, 2020 (CN) .......................... 202011197829.7

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC ............... H10K 59/131; G09G 3/3233; G09G 2300/0426; G09G 2300/0819;
(Continued)

(56) References Cited

U.S. PATENT DOCUMENTS 10,910,458 B2 * 2/2021 Matsueda .............. H10K 50/84
2017/0193953 A1 7/2017 Kim et al.
(Continued)

FOREIGN PATENT DOCUMENTS

| CN | 109976052 A | 7/2019 |
|---|---|---|
| CN | 111653603 A | 9/2020 |
| CN | 112310125 A | 2/2021 |

*Primary Examiner* — Karen Kusumakar
*Assistant Examiner* — Shawn Shaw Muslim
(74) *Attorney, Agent, or Firm* — HOUTTEMAN LAW LLC

(57) ABSTRACT

The present disclosure provides a display substrate and a display device, and belongs to the field of display technology. The display substrate of the present disclosure has a display region, and includes a base and a plurality of data lines and a plurality of fan-out traces on the base; each of the plurality of data lines is connected to a corresponding one of the plurality of fan-out traces at a connection node in the display region; and at least one of the plurality of data lines is connected to a corresponding fan-out trace at a plurality of connection nodes.

18 Claims, 5 Drawing Sheets

(52) U.S. Cl.
CPC ............... *G09G 2300/0819* (2013.01); *G09G 2300/0842* (2013.01)

(58) Field of Classification Search
CPC ......... G09G 2300/0842; G09G 3/3258; H10D 86/441; H10D 86/60
See application file for complete search history.

(56) References Cited

U.S. PATENT DOCUMENTS

| | | | |
|---|---|---|---|
| 2020/0176551 A1* | 6/2020 | Park | H10K 50/86 |
| 2022/0121072 A1* | 4/2022 | Chen | H10K 59/131 |

* cited by examiner

US 12,324,330 B2

DISPLAY SUBSTRATE AND DISPLAY DEVICE

CROSS-REFERENCE TO RELATED APPLICATION

This is a National Phase Application filed under 35 U.S.C. 371 as a national stage of PCT/CN2021/118413, filed on Sep. 15, 2021, the contents of which are incorporated herein in their entirety by reference.

TECHNICAL FIELD

The present disclosure relates to the field of display technology, in particular to a display substrate and a display device.

BACKGROUND

As application scenarios of a display panel are becoming more and more complex, the display panel with a regular shape cannot meet the needs of users, and thus a special-shaped display panel is more and more popular with users. Currently, in the special-shaped display panel, a layer of fan-out traces is generally disposed in a same layer as the layer in which source and drain electrodes of a thin film transistor are arranged in a display region, and on a side of a peripheral region surrounding the display region. With such arrangement, the fan-out traces occupy the space of a bezel of the display panel.

Since the display region is generally only provided with one metal layer of a gate electrode and one metal layer of source and drain electrodes therein, and the fan-out traces must use these two metal layers, the fan-out traces of the current special-shaped display panel can only be arranged in the peripheral region of the display panel, which increases the bezel of the display panel. A display panel with a large size and a high resolution is necessarily provided with more fan-out traces, further increasing the bezel of the display panel.

SUMMARY

The present disclosure aims to solve at least one of the problems of the prior art, and provides a display substrate and a display device.

In a first aspect, an embodiment of the present disclosure provides a display substrate, having a display region, and including a base and a plurality of data lines and a plurality of fan-out traces on the base; each of the plurality of data lines is connected to a corresponding one of the plurality of fan-out traces at a connection node in the display region; and at least one of the plurality of data lines is connected to a corresponding fan-out trace at a plurality of connection nodes.

Each of the plurality of data lines includes a first end and a second end, and the plurality of connection nodes at which the at least one of the plurality of data lines is connected to a corresponding fan-out trace are at the first end and the second end of the data line.

At least some of the plurality of data lines are connected to different numbers of pixel driving circuits; and a data line, to which a number of pixel driving circuits connected to is greater than a preset value, is connected to a corresponding fan-out trace at a plurality of connection nodes.

Each of the plurality of data lines is connected to a corresponding fan-out trace at a plurality of connection nodes.

The plurality of data lines and the plurality of fan-out traces are arranged side by side along a first direction and extend along a second direction; and an orthographic projection of the fan-out trace on the base covers an orthographic projection of a data line connected to the fan-out trace on the base.

The display substrate further includes a plurality of pixel driving circuit groups arranged side by side in the first direction; each of the plurality of pixel driving circuit groups includes a plurality of pixel driving circuits arranged side by side in the second direction; the pixel driving circuits in a same pixel driving circuit group are connected to a same data line; and any two adjacent ones of at least part of the plurality of pixel driving circuit groups are provided with two data lines therebetween, and the connection nodes at which the two data lines are connected to the corresponding fan-out traces are staggered in the first direction.

The display substrate further includes a first source-drain metal layer arranged on the base and including the plurality of data lines; a first interlayer insulating layer arranged on a side of the first source-drain metal layer facing away from the base; and a second source-drain metal layer arranged on a side of the first interlayer insulating layer facing away from the base and including the plurality of fan-out traces, wherein each fan-out trace is connected to a corresponding data line through a first via penetrating through the interlayer insulating layer.

The display substrate further includes a plurality of pixel driving circuits and a plurality of light emitting devices on the base; each of the plurality of pixel driving circuits includes at least a driving transistor; a second electrode of the driving transistor is connected to a first electrode of a corresponding light emitting device; the second source-drain metal layer further includes first relay electrodes each connected to a second electrode of a corresponding driving transistor; and the display substrate further includes: a second interlayer insulating layer disposed on a side of the second source-drain metal layer facing away from the base, and a second conductive layer disposed on a side of the second interlayer insulating layer facing away from the base and including the first electrode of each of the plurality of light emitting devices; wherein each first relay electrode is connected to a first electrode of a corresponding light emitting device through a second via penetrating through the second insulating layer.

The display region is special-shaped.

In a second aspect, an embodiment of the present disclosure provides a display device, which includes the display substrate in any one of the above embodiments.

DETAIL DESCRIPTION OF EMBODIMENTS

Figure 1:
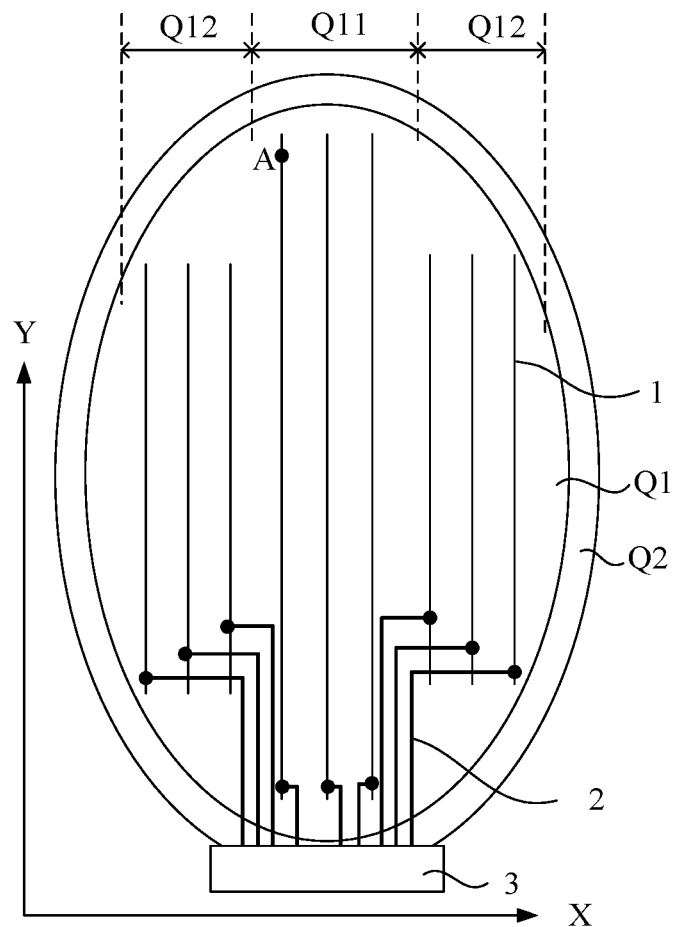
FIG. 1 is a schematic diagram of a partial structure of an exemplary display substrate.

In order to enable one of ordinary skill in the art to better understand the technical solutions of the embodiments of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

First and second directions refer to two different directions in the embodiment of the present disclosure. As an example, the first direction and the second direction are perpendicular to each other in the drawings, which does not limit the present disclosure. A first interlayer insulating layer is one or more insulating layers disposed between layers where data lines and fan-out traces are located; a second interlayer insulating layer is one or more insulating layers disposed between layers where first relay electrodes and first electrodes of light emitting devices are located.

FIG. 1 is a schematic diagram of a partial structure of an exemplary display substrate. As shown in FIG. 1, the display substrate is an elliptical display substrate having a display region Q1 and a peripheral region Q2 surrounding the display region Q1; the display region Q1 and the peripheral region Q2 are both elliptical. The display substrate includes a base 101 and a plurality of pixel unit groups arranged along a first direction X on the base 101 and in the display region Q1; each pixel unit group includes a plurality of pixel units arranged along a second direction Y, and each pixel unit includes a pixel driving circuit and a light emitting device D electrically connected to the pixel driving circuit. Pixel driving circuits in each pixel unit group are connected to a same data line 1. A plurality of first connection pads are disposed on one side (for example, the lower side in FIG. 1) of the peripheral region Q2 and arranged side by side along the first direction X; ends of the data lines 1 close to the first connection pads are connected to fan-out traces 2, respectively, and the fan-out traces 2 are connected to the first connection pads in one-to-one correspondence. Second connection pads on a flexible circuit board 3 (COF) are bonded to the first connection pads on the base 101 to supply data voltage signals to the data lines 1.

With continued reference to FIG. 1, in order to realize a narrow bezel of the display device, the fan-out traces 2 may be routed to the peripheral region Q2 through the display region Q1 and thus, be electrically connected to the first connection pads. Nodes where the data lines 1 are connected to the fan-out traces 2 are located in the display region Q1. The inventor found that the nodes where the data lines 1 are connected to the fan-out traces 2 are ends of the data lines 1 close to the first connection pads, so that due to line resistances of the data lines 1, ends (i.e., position A in FIG. 1) of the data lines 1 facing away from the first connection pads have the maximum signal transmission delay, which causes the display device to have non-uniform display.

In view of the above problems, the following technical solutions are provided in the embodiments of the present disclosure. Before describing the following solutions, some of words used in the embodiments of the present disclosure will be explained. In the embodiments of the present disclosure, ends of the data lines 1 close to the first connection pads are referred to as first ends p, and correspondingly, ends of the data lines 1 away from the first connection pads are referred to as second ends q. The "end" includes, but is not limited to, two opposite end points of the data line 1; each first end p refers to a segment of an end of the data line 1 away from the first connection pad; and each second end q refers to a segment of an end of the data line 1 close to the first connection pad. It should be noted that according to characteristics of the transistors, the transistors may be divided into N-type transistors and P-type transistors. For clarity, in the embodiments of the present disclosure, the technical solutions of the present disclosure will be described in detail by taking the case that the transistors are N-type transistors (for example, N-type MOS transistors) as an example. However, the transistors in the embodiments of the present disclosure are not limited to N-type transistors, and one skilled in the art may also implement functions of one or more transistors in the embodiments of the present disclosure by using P-type transistors (e.g., P-type MOS transistors) according to actual needs.

In addition, transistors used in the embodiments of the present disclosure may be thin film transistors or field effect transistors or other switching devices having the same characteristics. The thin film transistors may include oxide semiconductor thin film transistors, amorphous silicon thin film transistors or polysilicon thin film transistors, and the like. Each transistor includes a first electrode, a second electrode and a control electrode; the control electrode is used as a gate electrode of the transistor, one of the first electrode and the second electrode is used as a source electrode of the transistor, and the other one is used as a drain electrode of the transistor; the source and drain electrodes of the transistor may be symmetrical in structure, so that there may be no difference in physical structure therebetween. In the embodiments of the present disclosure, in order to distinguish transistors, except for the gate electrode serving as the control electrode, the first electrode is directly described as the source electrode, and the second electrode is the drain electrode, so that the source and the drain electrodes of all or some of the transistors in the embodiments of the present disclosure may be interchanged as necessary.

Figure 2:
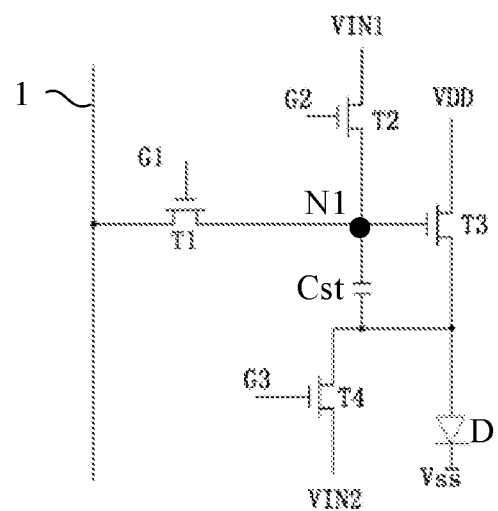
FIG. 2 is an exemplary pixel driving circuit.

FIG. 2 is an exemplary pixel driving circuit. As shown in FIG. 2, the pixel driving circuit according to an embodiment of the present disclosure may include a data writing transistor T1, a first reset transistor T2, a second reset transistor T3, a driving transistor T4; a source electrode of the data writing transistor T1 is connected to the data line 1, a drain electrode of the data writing transistor T1 is connected to a node N1, and a gate electrode of the data writing transistor T1 is connected to a first scan line G1; a source electrode of the first reset transistor T2 is connected to a first initialization signal line VIN1, a drain electrode of the first reset transistor T2 is connected to the node N1, and a gate electrode of the first reset transistor T2 is connected to a second scan line G2; a source electrode of the second reset transistor T3 is connected to a second plate of a storage capacitor, a drain electrode of the second reset transistor T3 is connected to a second initialization signal line VIN2, and a gate electrode of the second reset transistor T3 is connected to a third scan line G3; a source electrode of the driving transistor T4 is connected to a first power voltage line VDD, a drain electrode of the driving transistor T4 is connected to a second plate of the storage capacitor and the source electrode of the second reset transistor T3, and a gate electrode of the driving transistor T4 is connected to the node N1; a first plate of the storage capacitor is connected to the node N1.

In the embodiment of the present disclosure, the pixel driving circuit may have a circuit structure including other numbers of transistors and capacitors, such as a 7T1C, a 7T2C, a 6T1C, a 6T2C, or a 9T2C, in addition to the 4T1C (i.e., four transistors and one capacitor) shown in FIG. 2, which is not limited in the embodiments of the present disclosure.

A first electrode D1 of a light emitting device DD is connected to the drain electrode of the driving transistor T4, and a second electrode D2 of the light emitting device DD is connected to a second power voltage line VSS. The light emitting device DD may be a micro inorganic light emitting diode, and further, may be a current type light emitting diode, such as a micro light emitting diode (micro LED) or a mini light emitting diode (mini LED). Alternatively, the light emitting device DD in the embodiments of the present disclosure may be an organic light emitting diode (OLED). One of the first electrode D1 and the second electrode D2 of the light emitting device DD is an anode, and the other is a cathode. In the embodiment of the present disclosure, as an example, the first electrode D1 of the light emitting device DD is an anode, and the second electrode D2 is a cathode.

Figure 3:
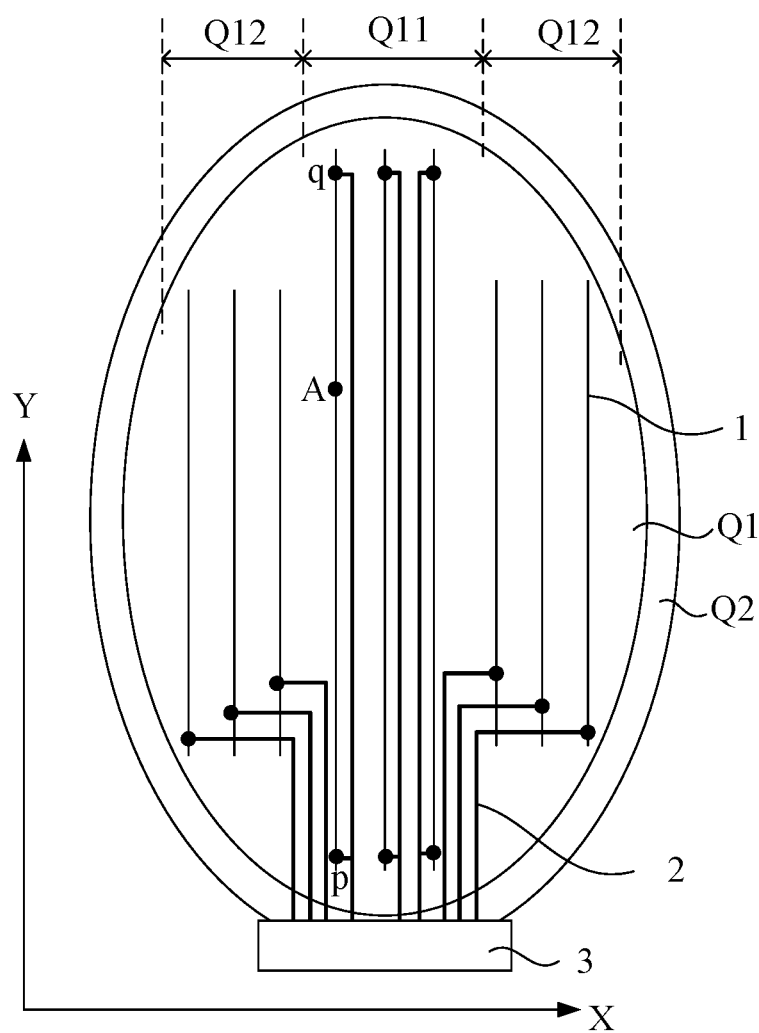
FIG. 3 is a schematic diagram of a partial structure of a display substrate according to an embodiment of the present disclosure.

In a first aspect, FIG. 3 is a schematic diagram of a partial structure of a display substrate according to an embodiment of the present disclosure. As shown in FIG. 3, the present disclosure provides a display substrate having a display region Q1 and a peripheral region Q2 surrounding the display region Q1, the display substrate includes a base 101, and a plurality of data lines 1 and a plurality of fan-out traces 2 disposed on the base 101; each data line 1 is connected to one fan-out trace 2 to provide a data voltage signal for the corresponding pixel driving circuit, and at least one data line 1 is connected to the corresponding fan-out trace 2 at a plurality of nodes (connection nodes) in the display region Q1.

Figure 4:
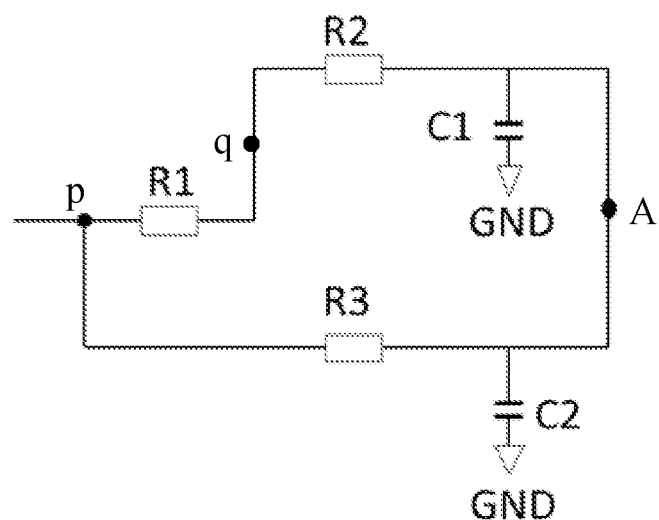
FIG. 4 is an equivalent circuit diagram of a case that nodes, at which one data line and one fan-out trace are connected, are located at a first end and a second end of the data line according to the embodiment of the present disclosure.

Referring to FIG. 3, a certain data line 1 and a corresponding fan-out trace 2 are connected to each other at two connection nodes in the display substrate, and the two connection nodes are respectively located at a first end p and a second end q of the data line 1. FIG. 4 is an equivalent circuit diagram of a case that nodes, at which one data line and one fan-out trace are connected to each other, are located at a first end and a second end of the data line according to the embodiment of the present disclosure. As shown in FIG. 4, an overall resistance of the fan-out trace 2 is R1; from the second end q of the data line 1 to a position with the maximum delay, a parasitic resistance is R2, and a parasitic capacitance is C2; from the first end p of the data line 1 to the position with the maximum delay, a parasitic resistance is R3, a parasitic capacitance is C3. The position with maximum transmission delay is calculated according to the equivalent circuit. By taking the total number of rows being N as an example, a parasitic resistance of the data lines 1 in one row of the pixel region is Rp, a capacitance is Cp. If the fan-out trace 2 and the data line 1 are made of the same material, $R1=N*Rp$; and if the position A with the maximum transmission delay is in the Xth row, the following equation may be obtained:

$$(N*Rp+(N-X)*Rp)(N-X)Cp=X*Rp*X*Cp.$$

From the formula, it may be known that $X=\frac{2}{3}N$, i.e., the transmission delay τ is decreased to 44% of the original value. That is, the position A with the maximum transmission delay is a position of the data line 1 whose distance from the first end p is ⅔ of a total length from the first end p to the second end q.

In summary, in the embodiment of the present disclosure, at least one data line 1 is connected to the corresponding fan-out trace 2 at a plurality of nodes (connection nodes) such that the transmission delay of the data voltage can be effectively reduced.

In some embodiments, each data line 1 includes the first end p and the second end q, and nodes (connection nodes) where the at least one data line 1 is connected to the corresponding fan-out trace 2 are located at the first end p and the second end q, respectively. That is, the number of the connection nodes at which the data line 1 is connected to the corresponding fan-out trace 2 is 2, which facilitates the connection of the data line 1 and the fan-out trace 2. In the embodiment of the present disclosure, description is given by taking the case that the number of the connection nodes at which the data line 1 is connected to the corresponding fan-out trace 2 is 2, and the two connection nodes are at the first end p and the second end q of the data line 1 as an example.

In some embodiments, at least part of the data lines 1 are connected to different numbers of the pixel driving circuits; the data line 1, to which the number of pixel driving circuits connected is greater than a preset value, is connected to a corresponding fan-out trace 2 at a plurality of connection nodes. For example: when the display region Q1 of the display substrate is special-shaped, such as elliptical, the plurality of pixel driving circuit groups are disposed in the display region Q1 and arranged along the first direction X, and each pixel driving circuit group includes a plurality of pixel driving circuits arranged along the second direction Y. The display region Q1 is elliptical, so the number of pixel driving circuits in the pixel driving circuit group located in a middle region Q11 of the display region Q1 is greater than the number of pixel driving circuits in the pixel driving circuit group located in an edge region Q12 of the display region Q1. In this case, each data line 1 in the middle region Q11 of the display region Q1 has the longest line length, so each data line 1 in the region has the maximum transmission delay at the second end q, and therefore, a plurality of connection nodes between the data line 1 and the corresponding fan-out trace 2 in the region may be provided, so as to reduce the transmission delay of the data voltage signal in the display substrate.

In one example, with continued reference to FIG. 3, when the display region Q1 is special-shaped, such as an ellipse as shown in FIG. 3, the number of pixel driving circuits in the second direction Y and in the middle region Q11 of the display region Q1 is greater than that of the edge region Q12. The first end p and the second end q of the data line 1 located in the middle region Q11 are electrically connected to the corresponding fan-out trace 2. From the equivalent circuit and the formula described above, the transmission delay τ is decreased to 44% of the original value. That is, the position A with the maximum transmission delay is a position whose distance from the first end p is ⅔ of a total length from the first end p to the second end q of the data line 1.

Figure 5:
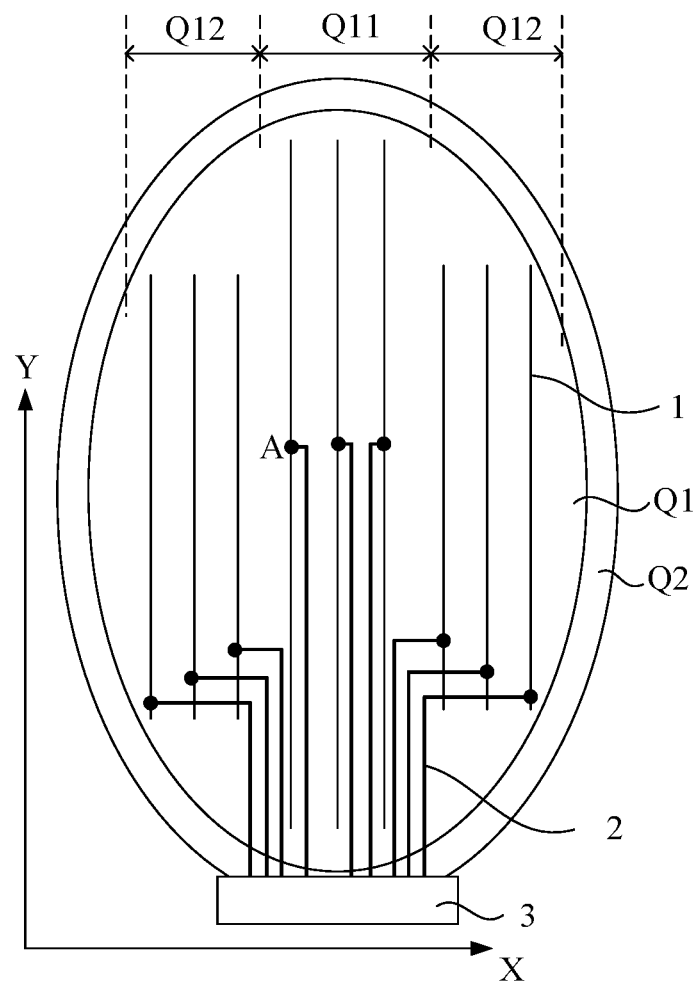
FIG. 5 is a schematic diagram of a partial structure of another display substrate according to an embodiment of the present disclosure.
Figure 6:
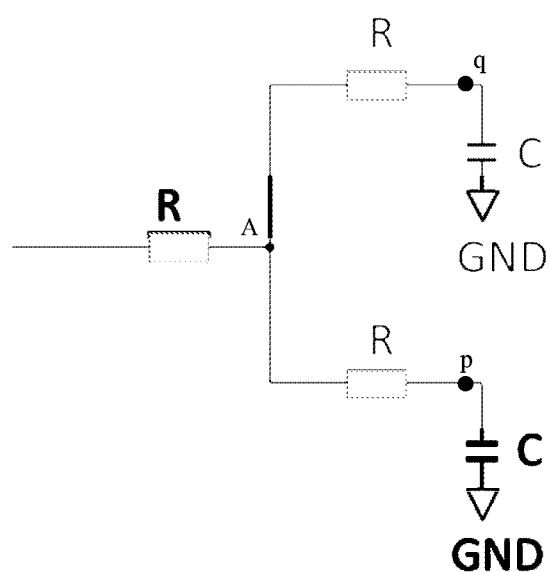
FIG. 6 is an equivalent circuit diagram of a case that a node, at which one data line and one fan-out trace are connected, is located at a center position of the data line according to the embodiment of the present disclosure.

In another example, FIG. 5 is a schematic diagram of a partial structure of another display substrate according to an embodiment of the present disclosure. As shown in FIG. 5, the structure is substantially the same as the structure of FIG. 3 except that a midpoint of the data line 1 located in the middle region Q11 is connected to the corresponding fan-out trace 2. FIG. 6 is an equivalent circuit diagram of the case that a node, at which one data line and one fan-out trace are connected to each other, is located at a center position of the data line according to the embodiment of the present disclosure. The maximum transmission delay is located at the center of the data line 1. As shown in FIG. 6, an overall resistance of the fan-out trace 2 is R; from the second end q of the data line 1 to a position with the maximum delay, a parasitic resistance is R, and a parasitic capacitance is C; from the first end p of the data line 1 to the position with the maximum delay, a parasitic resistance is R, a parasitic capacitance is C. The position with maximum transmission delay (that is, the position A with the maximum transmission delay) is calculated according to the equivalent circuit. By taking the total number of rows being N as an example, a parasitic resistance of the data lines 1 in a single row of the pixel region is Rp, a capacitance is Cp. If the fan-out trace 2 and the data line 1 are made of the same material, $R=(2/N)*Rp$; $C=(2/N)*Cp$; the maximum transmission delay $\tau=N*Rp*(2/N)*Cp=\frac{1}{2}(N*Rp*N*Cp)$. That is, the maximum transmission delay i is decreased by 50%.

Figure 7:
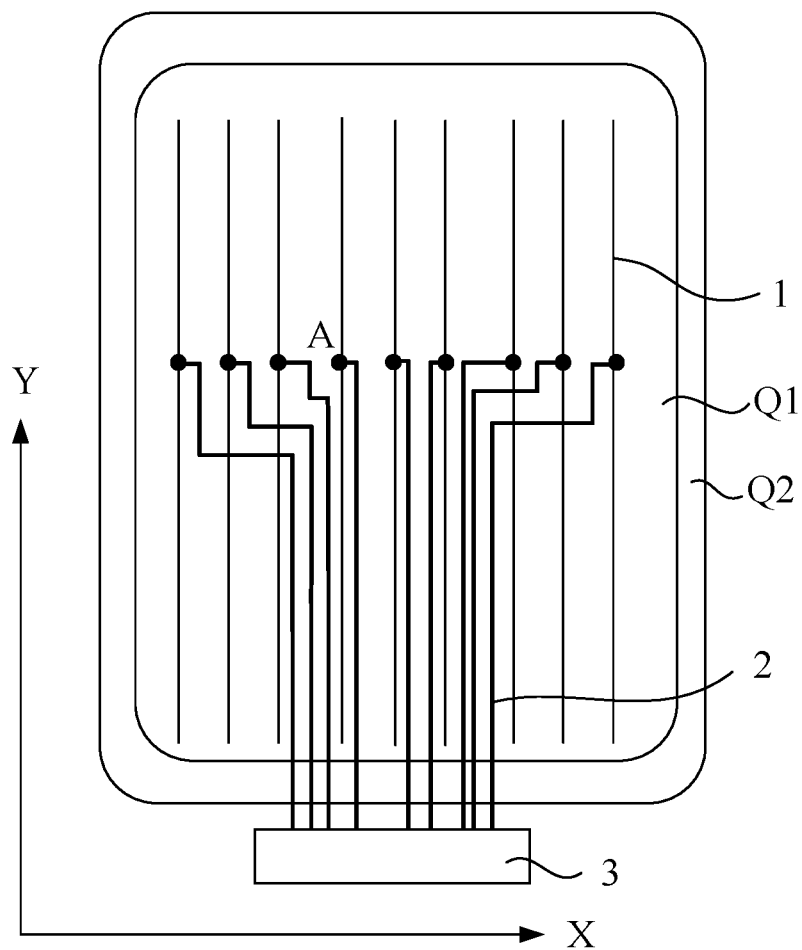
FIG. 7 is a schematic diagram of a partial structure of another display substrate according to an embodiment of the present disclosure.

In another example, FIG. 7 is a schematic diagram of a partial structure of another display substrate according to an embodiment of the present disclosure. As shown in FIG. 7, the display region Q1 of the display substrate is rectangular, in this case, the number of the pixel driving circuits in each pixel driving circuit group is the same, and each data line 1 is connected to the corresponding fan-out trace 2 at the center of the data line 1. The principle is the same as that of FIG. 7, so the maximum transmission delay is reduced by 50% for the whole display panel.

Figure 8:
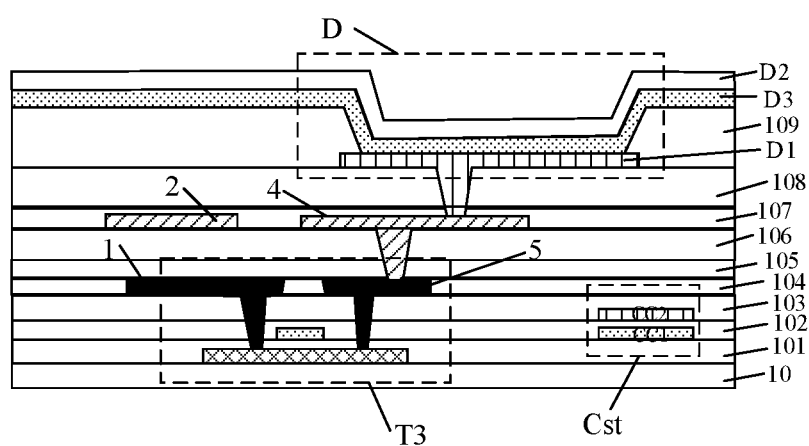
FIG. 8 is a cross-sectional view of a part of a display substrate according to an embodiment of the present disclosure.

FIG. 8 is a cross-sectional view of a part of a lower display substrate according to an embodiment of the present disclosure. As shown in FIG. 8, structures of the driving transistor T4, the storage capacitor and the light emitting device D are illustrated. An active layer, the source electrode and the drain electrode of the driving transistor T4 are arranged on the base 101; the source and drain electrodes may be formed by ion-doping source and drain regions of the active layer; the first gate insulating layer 102 is disposed on a side of the active layer of the driving transistor T4 facing away from the base 101; the gate electrode of the driving transistor T4 and the second plate of the storage capacitor are disposed on a side of the first gate insulating layer 102 facing away from the base 101; the second gate insulating layer 103 is disposed on a side of the gate electrode of the driving transistor T4 facing away from the base 101; the first plate of the storage capacitor is arranged on a side of the second gate insulating layer 103 facing away from the base 101; the interlayer insulating layer 104 is arranged on a side of the first plate of the storage capacitor facing away from the base 101; the data line 1 and the second relay electrode 5 are arranged on a side of the interlayer insulating layer 104 facing away from the base 101, and the data line 1 is connected to the source electrode of the driving transistor T4 through a third via penetrating through the interlayer insulating layer 104, the first gate insulating layer 102 and the second gate insulating layer 103; the second relay electrode 5 is connected to the drain electrode of the drive transistor T4 through a fourth via penetrating through the interlayer insulating layer 104, the first gate insulating layer 102 and the second gate insulating layer 103; a first planarization layer 105 and a first passivation layer 106 are sequentially arranged on a side of the data line 1 and the second relay electrode 5 facing away from the base 101; the fan-out trace 2 and the first relay electrode 4 are arranged on a side of the first passivation layer 106 facing away from the base 101, the fan-out trace 2 is connected to the data line 1 through a first via 11 penetrating through the first planarization layer 105 and the first passivation layer 106, and the first relay electrode 4 is connected to the second relay electrode 5 through a fifth via penetrating through the first planarization layer 105 and the first passivation layer 106; a second planarization layer 108 and a second passivation layer 107 are sequentially arranged on a side of the fan-out trace 2 and the first relay electrode 4 facing away from the base 101; the first electrode D1, the light emitting layer D3 and the second electrode D2 of the light emitting device D are sequentially disposed on a side of the second passivation layer 107 facing away from the base 101, and the first electrode D1 of the light emitting device D is connected to the first relay electrode 4 through a second via penetrating through the second planarization layer 108 and the second passivation layer 107.

In some embodiments, for each pixel driving circuit, an active semiconductor layer, a first gate insulating layer, a first conductive layer, a second gate insulating layer, a second conductive layer, an interlayer insulating layer 104, a first source-drain metal layer, a first planarization layer 105 and/or a first passivation layer 106, a second source-drain metal layer, a second planarization layer 108 and/or a second passivation layer 107 may be sequentially disposed on the base 101. The light emitting device D includes a first electrode D1, a second electrode D2, and a light emitting layer D3 between the first electrode D1 and the second electrode D2; one of the first electrode D1 and the second electrode D2 is an anode, and the other is a cathode; in the embodiment of the present disclosure, description is given by taking the case that the first electrode D1 is an anode, and the second electrode D2 is a cathode as an example. The anode of the light emitting device D may be positioned on a side of the second planarization layer 108 and/or the second passivation layer 107 facing away from the base 101. The active layer of each transistor is located in the active semiconductor layer, and includes a pattern of a doped region that may serve as source and drain electrodes for each transistor. The gate electrode of each transistor, one electrode of the storage capacitor (e.g., the second plate of the storage capacitor), the first scan line G1, the second scan line G2, and the third scan line G3 may be located in the first conductive layer. The other electrode of the storage capacitor (e.g., the first plate of the storage capacitor) and the first initialization signal line VIN1 and the second initialization signal line VIN2 may be located in the second conductive layer. The second relay electrode 5, the data line 1, the first power voltage line VDD, and the like may be located in the first source-drain metal layer. The first relay electrode 4, the fan-out trace 2 and the like may be located in the second source-drain metal layer. The first gate insulating layer, the second gate insulating layer, and the interlayer insulating layer 104 are formed therein with vias through which patterns in the above conductive layers and the active semiconductor layer are connected to each other. The second passivation layer 107 and/or the second planarization layer 108 are formed therein with vias through which the anode of the light emitting device D is connected to the drain electrode of the driving transistor T4.

In some embodiments, the active semiconductor layer may be formed by patterning the semiconductor material. The active semiconductor layer may be used to fabricate the active layers of the driving transistor T4, the data writing transistor T1, the first reset transistor T2 and the second reset transistor T3. The active semiconductor layer includes an active layer pattern (channel region) and a doped region pattern (source-drain doped region) of each transistor of each sub-pixel.

It is noted that the active semiconductor layer is provided on the base 101, and a buffer layer is formed between the base 101 and the active semiconductor layer, the active layer may include a low-temperature polysilicon layer which is integrally formed, and the source region and the drain region may be conducted by doping, to implement the electrical connection among the structures. That is, the active semiconductor layer of each transistor of each pixel driving circuit is an integral pattern formed of p-Si, and each transistor in the same pixel driving circuit includes the doped region pattern (i.e., the source region and the drain region) and the active layer pattern, with the active layers of different transistors being separated by a doped structure.

For example, the active semiconductor layer may be made of amorphous silicon, polycrystalline silicon, an oxide semiconductor material, or the like. It is noted that the source region and the drain region may be regions doped with n-type or p-type impurities.

In some embodiments, the plurality of data lines 1 and the plurality of fan-out traces 2 are all arranged along the first direction X and extend along the second direction Y; an orthographic projection of each fan-out trace 2 on the base 101 covers the orthographic projection of the data line 1 connected to the fan-out trace on the base 101. For example, the fan-out trace 2 is located on a side of the layer of the data line 1 facing away from the base 101, and the interlayer insulating layer 104 (such as the first planarization layer 105 and the first passivation layer 106 shown in FIG. 8) is disposed therebetween.

Figure 9:
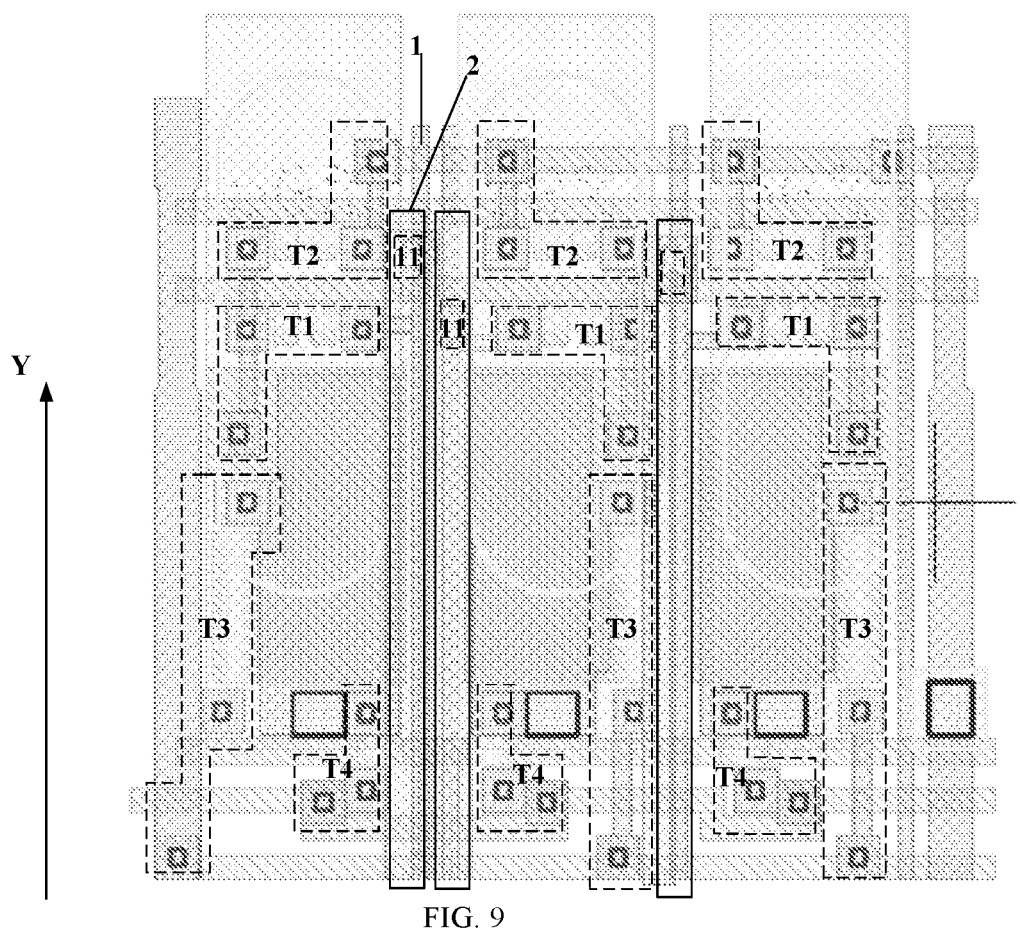
FIG. 9 is a layout of a display substrate according to an embodiment of the present disclosure.

In some embodiments, FIG. 9 is a layout of a display substrate according to an embodiment of the present disclosure. As shown in FIG. 9, each of the plurality of pixel driving circuit groups includes a plurality of pixel driving circuits arranged side by side in the second direction Y; pixel driving circuits in the same pixel driving circuit group is connected to the same data line 1; and any two adjacent ones of at least part of the pixel driving circuit groups are provided therebetween with two data lines 1, and the connection nodes at which the two data lines 1 are connected to the corresponding fan-out traces 2 are staggered in the first direction X. For example: any two adjacent ones of at least part of the pixel driving circuit groups in the display substrate are in mirror symmetry, and the data lines 1 connected to the pixel driving circuits in the two pixel driving circuit groups are located between the two pixel driving circuit groups. As shown in FIG. 9, the connection nodes at which the two data lines 1 are connected to the corresponding fan-out traces 2 are staggered in the first direction X, that is, the first vias 11 through which the two data lines 1 and the fan-out traces 2 are connected to each other are staggered, and the two first vias 11 are not located on a same straight line, so that the problem of a poor display panel caused by a concentrated distribution of the vias can be effectively alleviated.

In a second aspect, an embodiment of the present disclosure provides a display device, including the above display substrate. It should be noted that the display device provided in this embodiment may be: any product or component with a display function, such as a flexible wearable device, a mobile phone, a tablet computer, a television, a display, a notebook computer, a digital photo frame, a navigator and the like. It should be understood by one of ordinary skill in the art that other essential components are included in the display device, which is not described herein or should not be construed as limiting the present disclosure.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display substrate, having a display region, and comprising a base and a plurality of data lines and a plurality of fan-out traces on the base,
    wherein each of the plurality of data lines is connected to a corresponding one of the plurality of fan-out traces at a connection node in the display region; and
    at least one of the plurality of data lines is connected to a corresponding fan-out trace at a plurality of connection nodes.

2. The display substrate of claim 1, wherein each of the plurality of data lines comprises a first end and a second end, and
    the plurality of connection nodes at which the at least one of the plurality of data lines is connected to a corresponding fan-out trace are at the first end and the second end of the data line.

3. The display substrate of claim 1, wherein at least some of the plurality of data lines are connected to different numbers of pixel driving circuits; and
    a data line, to which a number of pixel driving circuits connected is greater than a preset value, is connected to a corresponding fan-out trace at a plurality of connection nodes.

4. The display substrate of claim 1, wherein each of the plurality of data lines is connected to a corresponding fan-out trace at a plurality of connection nodes.

5. The display substrate of claim 1, wherein the plurality of data lines and the plurality of fan-out traces are arranged side by side along a first direction and extend along a second direction; and
    an orthographic projection of the fan-out trace on the base covers an orthographic projection of a data line connected to the fan-out trace on the base.

6. The display substrate of claim 5, further comprising a plurality of pixel driving circuit groups arranged side by side in the first direction; wherein each of the plurality of pixel driving circuit groups comprises a plurality of pixel driving circuits arranged side by side in the second direction; and the pixel driving circuits in a same pixel driving circuit group are connected to a same data line; and any two adjacent ones of at least part of the plurality of pixel driving circuit groups are provided with two data lines therebetween, and the connection nodes at which the two data lines are connected to the corresponding fan-out traces are staggered in the first direction.

7. The display substrate of claim 1- or 2, further comprising:

a first source-drain metal layer on the base, the first source-drain metal layer comprising the plurality of data lines;

a first interlayer insulating layer on a side of the first source-drain metal layer facing away from the base; and a second source-drain metal layer on a side of the first interlayer insulating layer facing away from the base, and the second source-drain metal layer comprising the plurality of fan-out traces, wherein each fan-out trace is connected to a corresponding data line through a first via penetrating through the interlayer insulating layer.

8. The display substrate of claim 7, further comprising a plurality of pixel driving circuits and a plurality of light emitting devices on the base; wherein each of the plurality of pixel driving circuits comprises at least a driving transistor; a second electrode of the driving transistor is connected to a first electrode of a corresponding light emitting device;

the second source-drain metal layer further comprises first relay electrodes each connected to a second electrode of a corresponding driving transistor; and the display substrate further comprises:

a second interlayer insulating layer on a side of the second source-drain metal layer facing away from the base; and a second conductive layer on a side of the second interlayer insulating layer facing away from the base, the second conductive layer comprising the first electrode of each of the plurality of light emitting devices; wherein each first relay electrode is connected to a first electrode of a corresponding light emitting device through a second via penetrating through the second insulating layer.

9. The display substrate of claim 1, wherein the display region is special-shaped.

10. A display device, comprising the display substrate of claim 1.

11. The display device of claim 10, wherein each of the plurality of data lines comprises a first end and a second end, and the plurality of connection nodes at which the at least one of the plurality of data lines is connected to a corresponding fan-out trace are at the first end and the second end of the data line.

12. The display device of claim 10, wherein at least some of the plurality of data lines are connected to different numbers of pixel driving circuits; and a data line, to which a number of pixel driving circuits connected is greater than a preset value, is connected to a corresponding fan-out trace at a plurality of connection nodes.

13. The display device of claim 10, wherein each of the plurality of data lines is connected to a corresponding fan-out trace at a plurality of connection nodes.

14. The display device of claim 10, wherein the plurality of data lines and the plurality of fan-out traces are arranged side by side along a first direction and extend along a second direction; and an orthographic projection of the fan-out trace on the base covers an orthographic projection of a data line connected to the fan-out trace on the base.

15. The display device of claim 14, wherein the display substrate further comprises a plurality of pixel driving circuit groups arranged side by side in the first direction; wherein each of the plurality of pixel driving circuit groups comprises a plurality of pixel driving circuits arranged side by side in the second direction; and the pixel driving circuits in a same pixel driving circuit group are connected to a same data line; and any two adjacent ones of at least part of the plurality of pixel driving circuit groups are provided with two data lines therebetween, and the connection nodes at which the two data lines are connected to the corresponding fan-out traces are staggered in the first direction.

16. The display device of claim 10, wherein the display substrate further comprises:

a first source-drain metal layer on the base, the first source-drain metal layer comprising the plurality of data lines;

a first interlayer insulating layer on a side of the first source-drain metal layer facing away from the base; and a second source-drain metal layer on a side of the first interlayer insulating layer facing away from the base, and the second source-drain metal layer comprising the plurality of fan-out traces, wherein each fan-out trace is connected to a corresponding data line through a first via penetrating through the interlayer insulating layer.

17. The display device of claim 16, wherein the display substrate further comprises a plurality of pixel driving circuits and a plurality of light emitting devices on the base; each of the plurality of pixel driving circuits comprises at least a driving transistor; a second electrode of the driving transistor is connected to a first electrode of a corresponding light emitting device;

the second source-drain metal layer further comprises first relay electrodes each connected to a second electrode of a corresponding driving transistor; and the display substrate further comprises:

a second interlayer insulating layer on a side of the second source-drain metal layer facing away from the base; and a second conductive layer on a side of the second interlayer insulating layer facing away from the base, the second conductive layer comprising the first electrode of each of the plurality of light emitting devices; wherein each first relay electrode is connected to a first electrode of a corresponding light emitting device through a second via penetrating through the second insulating layer.

18. The display device of claim 10, wherein the display region is special-shaped.

* * * * *